(12) United States Patent
Stainer

(10) Patent No.: US 9,305,628 B2
(45) Date of Patent: Apr. 5, 2016

(54) SELF-REFERENCED MAGNETIC RANDOM ACCESS MEMORY (MRAM) AND METHOD FOR WRITING TO THE MRAM CELL WITH INCREASED RELIABILITY AND REDUCED POWER CONSUMPTION

(71) Applicant: CROCUS Technology SA, Grenoble (FR)

(72) Inventor: Quentin Stainer, Montbonnot-St-Martin (FR)

(73) Assignee: CROCUS TECHNOLOGY SA, Grenoble (FR)

( * ) Notice: Subject to any disclaimer, the term of this patent is extended or adjusted under 35 U.S.C. 154(b) by 0 days.

(21) Appl. No.: 14/649,591

(22) PCT Filed: Dec. 2, 2013

(86) PCT No.: PCT/EP2013/075254
§ 371 (c)(1),
(2) Date: Jun. 4, 2015

(87) PCT Pub. No.: WO2014/086718
PCT Pub. Date: Jun. 12, 2014

(65) Prior Publication Data
US 2015/0348607 A1  Dec. 3, 2015

(30) Foreign Application Priority Data
Dec. 7, 2012 (EP) .................................. 12290429

(51) Int. Cl.
G11C 11/00 (2006.01)
G11C 11/14 (2006.01)
G11C 11/16 (2006.01)

(52) U.S. Cl.
CPC .......... *G11C 11/1675* (2013.01); *G11C 11/161* (2013.01); *G11C 11/1673* (2013.01)

(58) Field of Classification Search
CPC ........ G11C 11/00; G11C 11/16; G11C 11/15; G11C 11/5607; G11C 11/1675; G11C 11/1673; G11C 13/003; G11C 29/816
See application file for complete search history.

(56) References Cited

U.S. PATENT DOCUMENTS

| 5,966,323 A | 10/1999 | Chen et al. |
| 6,794,695 B2 * | 9/2004 | Sharma .................. G11C 11/16 257/295 |

(Continued)

FOREIGN PATENT DOCUMENTS

| EP | 2109111 A1 | 10/2009 |
| EP | 2276034 A2 | 1/2011 |
| EP | 2575135 A1 | 4/2013 |

OTHER PUBLICATIONS

International Search Report for PCT/EP2013/075254 dated Feb. 5, 2014.

(Continued)

*Primary Examiner* — Hien Nguyen
(74) *Attorney, Agent, or Firm* — Pearne & Gordon LLP

(57) ABSTRACT

MRAM cell including a magnetic tunnel junction including a sense layer, a storage layer, a tunnel barrier layer and an antiferromagnetic layer exchange-coupling the storage layer such that the storage magnetization can be pinned when the antiferromagnetic layer is below a critical temperature and freely varied when the antiferromagnetic layer is heated at or above the critical temperature. The sense layer is arranged such that the sense magnetization can be switched from a first stable direction to another stable direction opposed to the first direction. The switched sense magnetization generates a sense stray field being large enough for switching the storage magnetization according to the switched sense magnetization, when the magnetic tunnel junction is heated at the writing temperature. The disclosure also relates to a method for writing to the MRAM cell with increased reliability and reduced power consumption.

8 Claims, 4 Drawing Sheets

(56) References Cited

U.S. PATENT DOCUMENTS

| | | | |
|---|---|---|---|
| 8,743,597 B2* | 6/2014 | Prejbeanu | G11C 11/1673 365/158 |
| 2007/0063690 A1* | 3/2007 | De Wilde | G01R 15/20 324/117 R |
| 2007/0177420 A1* | 8/2007 | Guo | B82Y 25/00 365/158 |
| 2008/0002462 A1* | 1/2008 | Ruehrig | G11C 11/16 365/174 |
| 2009/0027948 A1 | 1/2009 | Ruehrig | |
| 2009/0231909 A1* | 9/2009 | Dieny | B82Y 25/00 365/158 |
| 2010/0046288 A1* | 2/2010 | Honjou | G11C 11/16 365/171 |
| 2013/0083593 A1* | 4/2013 | Prejbeanu | G11C 11/16 365/158 |

OTHER PUBLICATIONS

Written Opinion for PCT/EP2013/075254 dated Feb. 5, 2014.

* cited by examiner

SELF-REFERENCED MAGNETIC RANDOM ACCESS MEMORY (MRAM) AND METHOD FOR WRITING TO THE MRAM CELL WITH INCREASED RELIABILITY AND REDUCED POWER CONSUMPTION

FIELD

The present disclosure concerns a self-referenced magnetic random access memory (MRAM) cell comprising a sense layer, a storage layer, and a tunnel barrier layer, and a method for writing to the MRAM cell with increased reliability and reduced power consumption by using a stray field induced by the sense layer.

DESCRIPTION OF RELATED ART

A MRAM cell using the so-called self-referenced reading operation typically comprise (see FIG. 1) a magnetic tunnel junction 2 formed of a magnetic storage layer 23 having a first storage magnetization 234 which direction can be changed from a first stable direction to a second stable direction, a thin insulating layer 22, and a sense layer 21 having a sense magnetization 210 with a reversible direction. The self-referenced MRAM cell allows for performing the write and read operation with low power consumption and an increased speed. The self-referenced MRAM can further be read by using a dynamic reading operation having improved robustness against variability from one MRAM cell to another. In FIG. 1, the storage layer 23 is represented as a synthetic storage layer including a first storage layer 231 and a second storage layer 233 being separated by a spacer layer 232.

Switching of the storage magnetization during a write operation of the self-referenced MRAM cell can be performed by using magnetostatic interactions between the storage and the sense layer. Such switching is often called dipolar-induced switching and allows for using a switching field having lower magnitude than switching field used in non-self-referenced MRAM cells. FIG. 2 shows the MRAM cell during the self-referenced writing operation. A magnetic field 42 is applied such as to switch the sense magnetization 210. The writing operation further involves heating the magnetic tunnel junction 2 at or above the critical temperature of an antiferromagnetic layer (layer 24 in FIG. 1) at which the storage magnetization 234 can be freely oriented. Heating is performed while the switching field 42 is being applied such that the storage magnetization can be oriented in accordance with the switched sense magnetization 210 and the switching field 42. The magnetic tunnel junction is then cooled below the critical temperature such as to pin the storage magnetization in its written state. FIG. 3 shows the MRAM cell 1 after the write operation with the sense magnetization 210 being switched with the magnetic field 42 and the storage magnetization 234 being also switched in its written direction by the magnetic field 42 and the switched sense magnetization 210.

During such write operation however, the storage magnetization may not be fully recovered, i.e., aligned along an easy axis of the storage layer, once the magnetic tunnel junction has been cooled below the critical temperature. Indeed, the storage magnetization may remain orientable due to restoration of the exchange coupling of the antiferromagnetic layer during cooling, while the storage layer is in a non-saturated state, leading to a magnetically frustrated configuration. This can yield reduced reproducibility of the writing operation.

EP2276034 discloses MRAM cell and a method for writing the MRAM cell comprising switching a magnetization direction of said storage layer to write data to said storage layer.

EP2575135 discloses a method for writing and reading an MRAM cell wherein a net local magnetic stray field couples the storage layer with the sense layer.

US2009027948 concerns an MRAM cell including a first magnetic layer arrangement having a magnetization which corresponds to a predefined ground state magnetization, a non-magnetic spacer layer coupled to the first layer arrangement, a second magnetic layer arrangement disposed on the opposite side of the non-magnetic spacer layer with regard to the first magnetic layer arrangement, the second magnetic layer arrangement having a magnetization fixation temperature that is lower than the magnetization fixation temperature of the first magnetic layer arrangement, and at least a portion of the second magnetic layer arrangement having a closed magnetic flux structure in its demagnetized state.

U.S. Pat. No. 5,966,323 discloses a low switching field magnetoresistive tunnelling junction memory cell including a first exchange coupled structure and an exchange interaction layer so as to pin the magnetic vectors of the pair of layers anti-parallel, a second exchange coupled structure having a pair of magnetoresistive layers and an exchange interaction layer so as to pin the magnetic vectors of the pair of layers anti-parallel. Each of the first and second exchange coupled structures, and hence the memory cell has no net magnetic moment.

EP2109111 discloses a method for writing an MRAM cell comprising a current line wherein the current line has a first function for passing a first portion of current for heating the junction, and a second function for passing a second portion of current in order to switch the magnetization of the first magnetic layer.

SUMMARY

The present disclosure concerns a self-referenced MRAM cell comprising a magnetic tunnel junction including a sense layer having a sense magnetization; a storage layer having a storage magnetization; a tunnel barrier layer comprised between the sense and the storage layers; and an antiferromagnetic layer exchange-coupling the storage layer such that the storage magnetization can be pinned when the antiferromagnetic layer is below a critical temperature and freely varied when the antiferromagnetic layer is heated at or above the critical temperature; wherein said sense layer is arranged such that the sense magnetization can be switched from a first stable direction to another stable direction opposed to the first direction; the switched sense magnetization generating a sense stray field being large enough for switching the storage magnetization according to the switched sense magnetization, when the magnetic tunnel junction is heated at the writing temperature.

The sense magnetization can be larger than the net storage magnetization. The sense layer can have a coercive field being higher than a net storage magnetic stray field induced by the storage magnetization. The sense layer can have a magnetic anisotropy. The magnetic anisotropy can comprise at least one of an elliptical shape or a hard magnetic material.

The storage magnetization can comprise a first storage layer, a spacer layer and a second storage layer; the storage magnetization comprising a first storage magnetization of the first storage layer and a second storage magnetization of the second storage layer, the spacer layer magnetically coupling the first storage magnetization antiparallel with the second storage magnetization. The antiferromagnetic layer can exchange-couple the first storage layer. The sense layer can have a thickness being larger than the difference between the thickness of the first storage layer and the thickness of the second storage layer multiplied by the ratio of the storage magnetization to the sense magnetization.

The present disclosure further concerns a method for writing to the MRAM cell comprising:

switching the sense magnetization from a first direction to a second direction opposed to the first direction, the switched sense magnetization generating a local sense stray field; and passing a heating current pulse in the magnetic tunnel junction for heating the magnetic tunnel junction at or above the critical temperature such as to switch the storage magnetization in accordance with the sense stray field;

wherein the method further comprises the step of turning off the write magnetic field; and wherein applying a heating current pulse is performed after turning off the write magnetic field.

The self-referenced MRAM cell using the method for write disclosed herein allows for better reliability during the writing operation compared to writing a conventional self-referenced MRAM cell due to the writing sequence allowing the storage magnetization to relax in a more stable magnetic configuration.

The self-referenced MRAM cell in combination with the writing method allows for reducing power consumption since the write magnetic field is applied only for switching the sense magnetization and does not need to overcome the intrinsic switching field of the storage layer during switching of the first storage magnetization. Moreover, since the write magnetic field can be small, the same magnetic field can be used for both the write magnetic field and the first and second read magnetic fields.

In the present description, the expression "magnetization" is used indifferently to describe a magnetic moment of the magnetic layer and the magnetization induced by the magnetic moment.

BRIEF DESCRIPTION OF THE DRAWINGS

The invention will be better understood with the aid of the description of an embodiment given by way of example and illustrated by the figures, in which.

DETAILED DESCRIPTION OF POSSIBLE EMBODIMENTS

Figure 4:
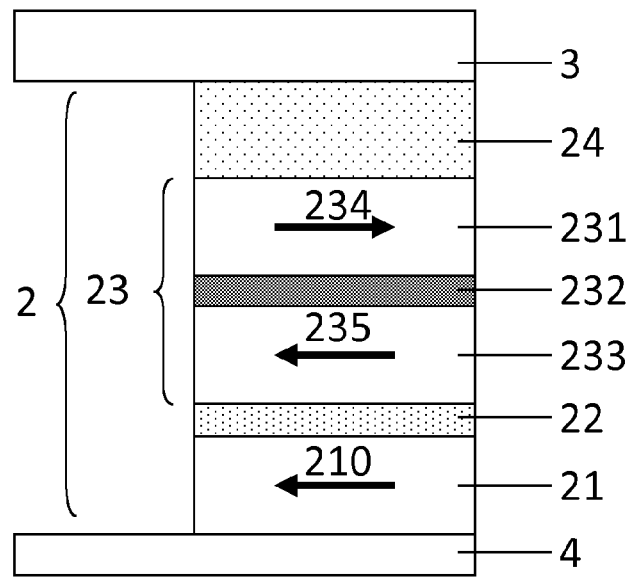
FIG. 4 shows a self-referenced MRAM cell prior to a writing operation, according to an embodiment.

FIG. 4 shows a MRAM cell 1 arrangement according to an embodiment. The MRAM cell 1 comprises a magnetic tunnel junction 2 comprising a sense layer 21 having a first magnetization 210; a storage layer 23; a tunnel barrier layer 22 comprised between the sense and the storage layers 21, 23; and an antiferromagnetic layer 24 exchange-coupled with the storage layer 23. In the example of FIG. 4, the storage layer 23 is a synthetic storage layer including a first storage layer 231 having a first storage magnetization 234, a second storage layer 233 having a second storage magnetization 235, the first and second ferromagnetic layers 231, 233 being separated by a spacer layer 232. The first and second storage layers 231, 233 can be made of a material such as, for example, cobalt iron (CoFe), cobalt iron boron (CoFeB), nickel iron (NiFe), Cobalt (Co), etc. The thickness of the first and second storage layer 231, 233 can be comprised, for example, between 1 nm and 10 nm.

The dimensions (e.g., thickness) of the spacer layer 232 may be selected to cause the first and second storage layers 231 and 233 to be magnetically coupled, via RKKY interaction, so that the first storage magnetization 234 is oriented anti-parallel with the second magnetization 235. The thickness may depend on the material that the spacer layer 232 is formed from. For example, the spacer layer 232 can be made from a non-magnetic material selected from the group comprising, for example, ruthenium (Ru), rhenium (Re), rhodium (Rh), tellurium (Te), yttrium (Y), chromium (Cr), iridium (Ir), silver (Ag), copper (Cu), etc. In an embodiment, the thickness may be between about 0.2 nm and 3 nm. However, other thicknesses may be suitable to couple the two storage layers 231 and 233.

The exchange-coupling between the antiferromagnetic layer 24 and the synthetic storage layer 23 is such that the first storage magnetization 234 is pinned below a critical temperature of the antiferromagnetic layer 24 and can be freely oriented at and above the critical temperature. The antiferromagnetic layer 24 can be made from a manganese-based alloy, such as IrMn, PtMn or FeMn, or any other suitable materials. The sense layer 21 is not exchange biased.

The tunnel barrier layer 22 is a thin layer, typically in the nanometer range and can be formed, for example, from any suitable insulating material, such as alumina or magnesium oxide.

Figure 5:
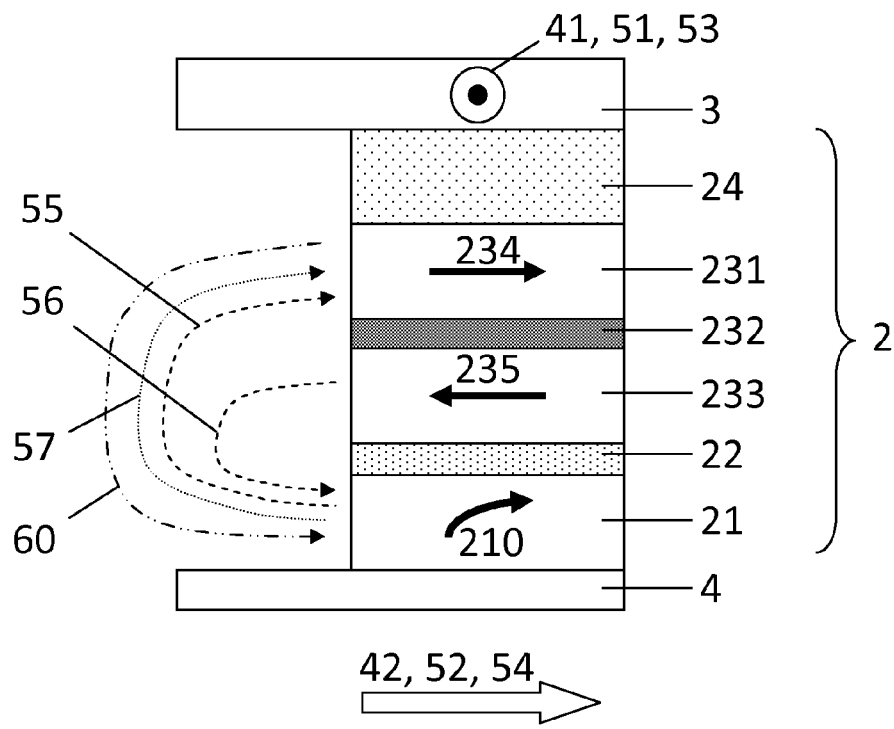
FIG. 5 shows the self-referenced MRAM cell and a dipolar-induced method for writing to the MRAM cell comprising a step of applying a magnetic field to the MRAM cell, according to an embodiment.

In an embodiment represented in FIG. 5, a dipolar-induced method for writing to the MRAM cell 1 comprises switching the sense magnetization 210 from a first direction to a second switched direction, opposed to the first direction. In FIG. 4, the first direction if the sense magnetization 210 is represented towards the left side of the page and the switched second direction is shown in FIG. 5 towards the right side of the page. Switching the sense magnetization 210 can comprise applying a write magnetic field 42 having a suitable magnitude. The second direction of the switched sense magnetization 210 is oriented in accordance to the direction of the write magnetic field 42. The write magnetic field 42 is applied prior to heating the magnetic tunnel junction 2 at a read temperature, for example at room temperature. Thus, during applying the write magnetic field 42, the magnetic tunnel junction 2 is at a temperature being below the critical temperature and the storage magnetization remains pinned by the antiferromagnetic layer 24. The switched sense magnetization 210 generates a local sense stray field shown by the arrow indicated by numeral 60 in FIG. 5. The sense stray field 60 induces in turn a magnetic coupling between the sense magnetization 210 and the first and second storage magnetizations 234, 235 in a closed magnetic flux configuration.

Figure 2:
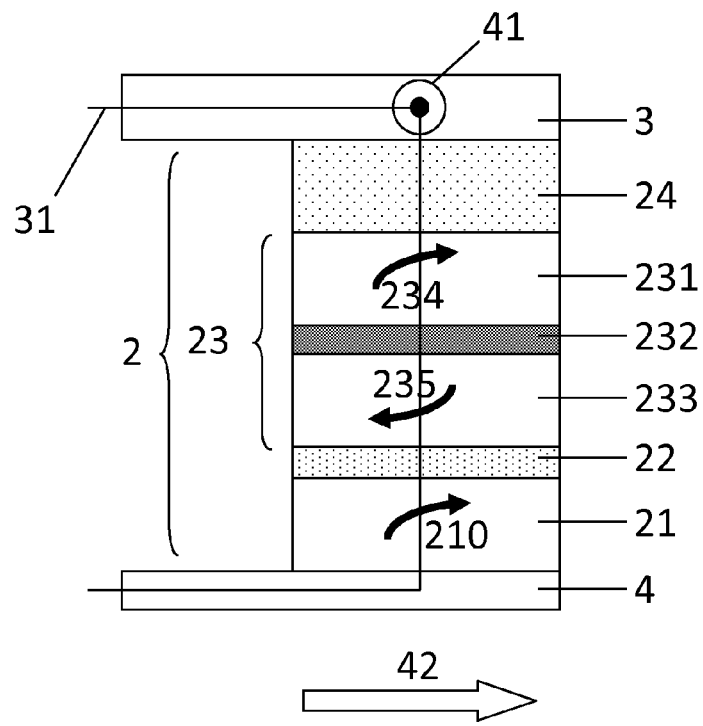
FIG. 2 shows the MRAM cell during a dipolar-induced writing operation.

The write magnetic field 42 can be applied by passing a write current 41 in an upper current line 3 in electrical communication with one end of the magnetic tunnel junction 2, disposed on top of the magnetic tunnel junction 2, in example of FIG. 2. Alternatively, the write current 41 can be passed in a field line (not represented) located above the upper current line 3 or at the other end of the magnetic tunnel junction 2.

Once the sense magnetization 210 has been switched, the write magnetic field 42 is turned off. After turning off the write magnetic field 42, a heating current pulse 31 is passed in the magnetic tunnel junction 2 such as to heat the magnetic tunnel junction 2 at a writing temperature corresponding to the critical temperature or being above the critical temperature of the antiferromagnetic layer 24, and thus, free the first storage magnetization 234 (see FIG. 6). The heating current pulse 31 can be passed in the magnetic tunnel junction 2 via the upper current line 3 and a lower current line 4 electrically connected to the other end of the magnetic tunnel junction 2.

Figure 6:
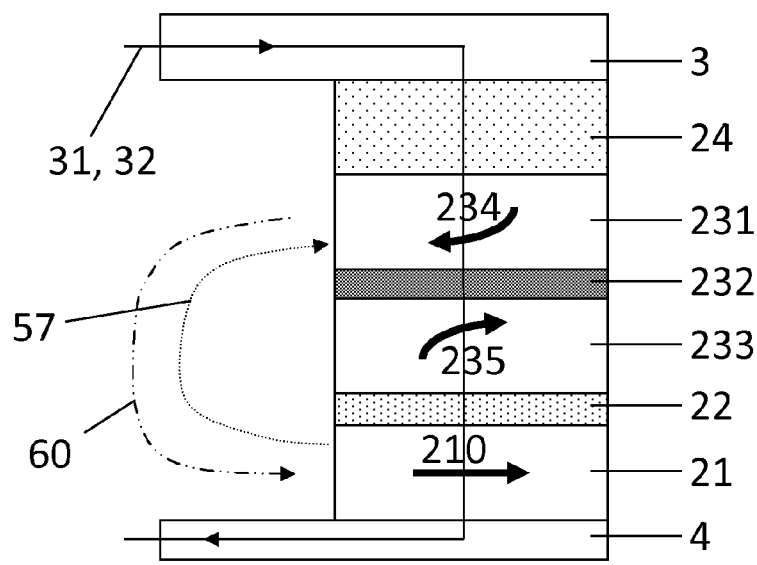
FIG. 6 shows the self-referenced MRAM cell and the method for writing to the MRAM cell comprising a step of passing heating current pulse in the MRAM cell, according to another embodiment.

Once the magnetic tunnel junction 2 has reached the writing temperature, one of the first and second storage magnetization 234, 235 is switched due to the presence of the sense stray field 60. In fact, the sense stray field 60 switches the larger of the first storage magnetization 234 and the second storage magnetization 235. In the example of FIG. 6, the first storage magnetization 234 is larger than the second storage magnetization 235 and is switched by the sense stray field 60, in accordance with the direction of the sense stray field 60. Due to the anti-parallel coupling between first and second storage layers 231, 233, the second storage magnetizations 235 will also switch in order to remain antiparallel to the first storage magnetizations 234 (see FIG. 6). In the example of FIG. 6, the second storage magnetization 235 is switched parallel to the sense magnetization 210 resulting in a low resistance $R_1$ of the MRAM cell 1. The storage magnetization 234, 235 is thus switched in the absence of the write magnetic field 42, i.e., one of the first and second storage magnetizations 234, 235, depending on their relative magnitude, is switched by the sense stray field 60 and the other storage magnetization 235, 234 is switched antiparallel in the opposite direction due to the anti-parallel coupling induced by the spacer layer 232.

After switching of the first and second storage magnetizations 234, 235, the heating current pulse 31 can be turned off such as to cool the magnetic tunnel junction 2, for example at the read temperature that is below the critical temperature, such as to pin the first storage magnetization 234 in the written state.

Figure 1:
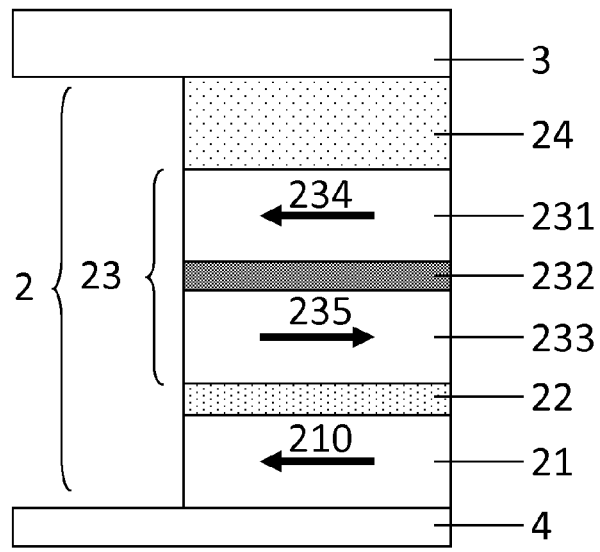
FIG. 1 shows a schematic view of a conventional self-referenced MRAM cell prior to a writing operation.
Figure 3:
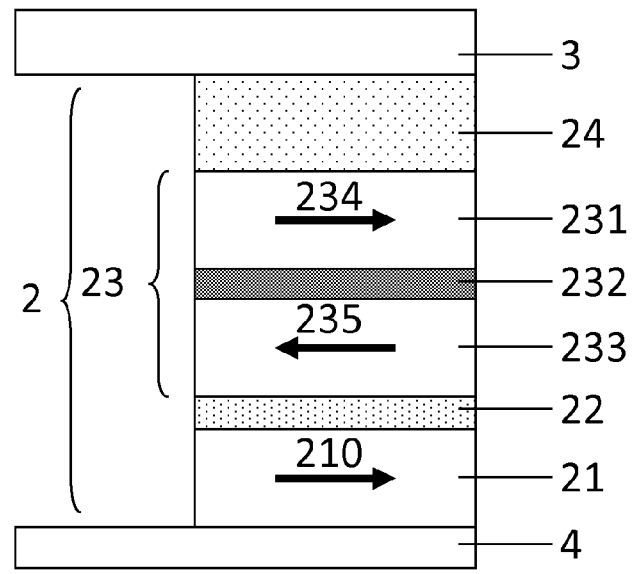
FIG. 3 shows the conventional MRAM cell after the write operation.
Figures 7, 8:
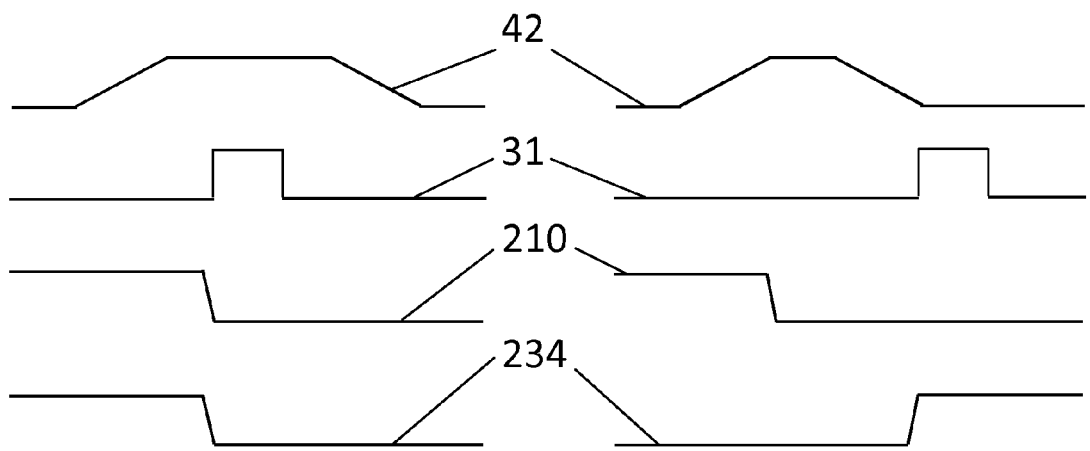
FIG. 7 reports chronograms of the write magnetic field and of the heating current pulse during the writing of a conventional MRAM cell.
FIG. 8 reports chronograms of the write magnetic field and of the heating current pulse during the writing of the MRAM cell.

FIG. 8 reports chronograms of the write magnetic field 42 and of the heating current pulse 31 according to the method for writing to the MRAM cell 1 as disclosed herein. In particular, the abscissa represents a time scale and the ordinate the magnitude for the write magnetic field 42 and a magnitude of the heating current pulse 31. FIG. 8 shows the onset of the heating current pulse 31 located after the end of the write magnetic field pulse 42. Also reported in FIG. 8 are chronograms of the sense magnetization 210 and of the first storage magnetization 234 where the ordinate represents the direction of the magnetizations 210, 234. The chronograms show the sense magnetization 210 and the first storage magnetization 234 being switched sequentially upon application of the write magnetic field 42 and of the heating current pulse 31, respectively. In the example of FIG. 8, the first direction of the sense magnetization 210 and of the first storage magnetization 234 is opposed to their switched orientation, as illustrated in FIG. 4 and FIG. 5. FIG. 7 reports chronograms of the write magnetic field 42 and of the heating current pulse 31 in the case of a conventional method for writing a conventional self-referenced MRAM cell (such as the one shown in FIGS. 1 to 3). As shown in FIG. 7, the heating current pulse 31 is located while the write magnetic field 42 is applied. Switching of the first storage magnetization 234 and of the sense magnetization 210 occur simultaneously under the action of the write magnetic field 42.

A dipolar coupling can occur between the storage layer 23 and the sense layer 21. Such dipolar coupling is caused by a first local storage magnetic stray field 55 induced by the first storage magnetization 234 and a second local storage magnetic stray field 56 induced by the second storage magnetization 235. The first and second storage magnetic stray fields 55, 56, are shown in FIG. 5 coupling the first and second storage magnetizations 234, 235 with the sense magnetization 210 of the sense layer 21 in a closed magnetic flux configuration. The magnitude of the dipolar coupling, or the net storage magnetic stray field 57, corresponds to the sum of the first and second storage magnetic stray fields 55, 56.

Switching the storage magnetization 234, 235 using the sense stray field 60 requires that the sense stray field 60 is larger than the net storage magnetic stray field 57, when the magnetic tunnel junction 2 is at the writing temperature. This is achieved by the sense magnetization 210 being larger than the net magnetization of the storage layer 23, the net magnetization of the storage layer corresponding to the sum of the first and second storage magnetization 234, 235. The larger sense magnetization 210 can be achieved by using high magnetization materials for the sense layer 21, such as materials used in permanent magnets, or by a suitable thickness of the sense layer 21, or by a combination of the two former conditions. The suitable thickness of the sense layer 21 can comprise a thickness being larger than the storage magnetization 234, 235 multiplied by the difference between the thickness of the first storage layer 231 and the thickness of the second storage layer 233, divided by the sense magnetization 210.

The dipolar-induced writing method further requires that the sense magnetization 210 remains stable in the switched orientation after turning off the write magnetic field 42. The stability of the switched sense magnetization 210 can be achieved by the sense layer 21 having a coercive field being higher than the net storage magnetic stray field 57. Such high coercivity of the sense layer 21 can be achieved by the sense layer 21 having a magnetic anisotropy, and/or the sense layer 21 comprising a hard magnetic material. The magnetic anisotropy can comprise shape anisotropy, for example wherein the sense layer 21 has an elliptical shape, or magnetocrystalline anisotropy. The hard magnetic material can comprise one the materials used in permanent magnets.

The MRAM cell 1 is not limited to the configuration of the above embodiment as long as the MRAM cell 1 can be written using the writing method disclosed herein. For example, the storage layer 23 can comprise only the first storage layer 231 having the first storage magnetization 234 being switched by the sense stray field 60 induced by the sense magnetization 210. Here, the net local magnetic stray field corresponds to the sole contribution of the first storage magnetic stray field 55 and the net storage magnetization corresponds to the first storage magnetization 234.

According to an embodiment, a read operation of the MRAM cell 1 comprises a first read cycle including applying a first read magnetic field 52 adapted for aligning the sense magnetization 210 in a first direction, in accordance with the first orientation of the first read magnetic field 52. The first read magnetic field 52 can be applied by passing a first read field current 51 having a first polarity in the upper current line 3. The first direction of the sense magnetization 210 is then compared with the second storage magnetization 235 by passing a sense current 32 though the magnetic tunnel junction 2. The voltage measured across the magnetic tunnel junction 2 yields a corresponding first resistance value $R_1$ of the magnetic tunnel junction 2 (corresponding to the high or low resistance $R_H$, $R_L$).

The read operation of the MRAM-based cell 1 can further comprise a second read cycle comprising applying a second read magnetic field 54 adapted for aligning the sense magnetization 210 in a second direction opposed to the first direction, in accordance with the second orientation of the second read magnetic field 54. The second read magnetic field 54 can be applied by passing a second read field current 53 having a second polarity in the upper current line 3. The second direction of the sense magnetization 210 is then compared with the second storage magnetization 235 by passing the sense current 32 though the magnetic tunnel junction 2. Measuring a voltage across the magnetic tunnel junction 2 when the sense current 32 is passed through the magnetic tunnel junction 2 yields a corresponding second resistance value $R_2$ of the magnetic tunnel junction 2. The data written in the MRAM cell 1 can then be determined by a difference between the first and second resistance value $R_1$, $R_2$.

In an embodiment, a magnetic memory device (not represented) can comprise a plurality of the MRAM cells 1 arranged in rows and columns. The magnetic memory device can further comprise one or a plurality of the upper current line 3 that connect the MRAM cells 1 along a row, and one or a plurality of the lower current line 4 coupled to the MRAM cells 1 along a column. The magnetic memory device can further comprise a device package, the plurality of the MRAM cells 1 being disposed within the device package.

An advantage of the MRAM cell 1 and of the method for writing the MRAM cell 1 includes increased reproducibility of the writing operation since the storage magnetization (i.e., the first and/or second storage magnetization 234, 235) will spontaneously relax to a lowest energy state without being constraint by an external field, such as the write magnetic field 42, which could induce spin-flopping configurations in the storage magnetizations 234, 235.

The MRAM cell 1 in combination with the writing method allows for reducing power consumption since the write magnetic field 42 is applied only for switching the sense magnetization 210 and does not need to overcome the intrinsic switching field of the storage layer 23. Since the write magnetic field 42 can be small the same magnetic field can be used for both the write magnetic field 42 and the first and second read magnetic fields 52, 53. Moreover, an improved reliability of the configuration of the storage magnetization 234, 235 in the written state can be achieved, yielding an improved reliability of the resistance levels of the magnetic tunnel junction 2.

REFERENCE NUMBERS AND SYMBOLS 1 magnetic random access memory (MRAM) cell
2 magnetic tunnel junction
21 sense layer
210 sense magnetization
23 storage layer
231 first storage layer
232 spacer layer
233 second storage layer
234 first storage magnetization
235 second storage magnetization
24 antiferromagnetic layer
3 upper current line
31 heating current pulse
4 lower current line
41 field current
42 write magnetic field
55 first storage magnetic stray field
56 second storage magnetic stray field
57 net storage magnetic stray field
60 sense stray field
$R_1$ first resistance value
$R_2$ second resistance value

The invention claimed is:

1. Method for writing to the MRAM cell comprising a magnetic tunnel junction including a sense layer having a sense magnetization; a storage layer having a storage magnetization; a tunnel barrier layer comprised between the sense and the storage layers; and an antiferromagnetic layer exchange-coupling the storage layer such that the storage magnetization can be pinned when the antiferromagnetic layer is below a critical temperature and freely varied when the antiferromagnetic layer is heated at or above the critical temperature; said sense layer is arranged such that the sense magnetization can be switched from a first stable direction to another stable direction opposed to the first direction; the switched sense magnetization generating a sense stray field being large enough for switching the storage magnetization according to the switched sense magnetization, when the magnetic tunnel junction is heated at the writing temperature; the method comprising:

switching the sense magnetization from a first direction to a second direction opposed to the first direction, the switched sense magnetization generating a local sense stray field;

passing a heating current pulse in the magnetic tunnel junction for heating the magnetic tunnel junction at or above the critical temperature such as to switch the storage magnetization in accordance with the sense stray field; and turning off the write magnetic field;

the heating current pulse being passed after turning off the write magnetic field.

2. The method according to claim 1, wherein said switching the sense magnetization comprises applying a write magnetic field adapted for switching the sense magnetization according to the direction of the write magnetic field.

3. The method according to claim 1, further comprising turning off the heating current pulse such as to cool the magnetic tunnel junction below the critical temperature and pin the storage magnetization in the written state.

4. The method according to claim 1, wherein the MRAM cell further comprises a current line in electrical communication with one end of the magnetic tunnel junction; and wherein the heating current pulse is passed in the magnetic tunnel junction via the current line.

5. The method according to claim 4, wherein said applying a write magnetic field comprises passing a write current in the current line.

6. The method according to claim 1, wherein the sense magnetization is larger than the net storage magnetization.

7. The method according to claim 1, wherein the sense layer has a coercive field being higher than a storage magnetic stray field induced by the storage magnetization.

8. The method according to claim 1, wherein said storage magnetization comprises a first storage layer, a spacer layer and a second storage layer; the storage magnetization comprising a first storage magnetization of the first storage layer and a second storage magnetization of the second storage layer, the spacer layer magnetically coupling the first storage magnetization antiparallel with the second storage magnetization; the sense stray field inducing a magnetic coupling between the sense magnetization and the first and second storage magnetizations in a closed magnetic flux configuration.

* * * * *